United States Statutory Invention Registration [19]

[11] Reg. Number: H665

Knolle et al. [43] Published: Aug. 1, 1989

[54] RESISTIVE FIELD SHIELDS FOR HIGH VOLTAGE DEVICES

[75] Inventors: William R. Knolle, Lower Macungie Township, Lehigh County; John W. Osenbach, Spring Township, Berks County, both of Pa.

[73] Assignee: Bell Telephone Laboratories, Incorporated, Murray Hill, N.J.

[21] Appl. No.: 110,153

[22] Filed: Oct. 19, 1987

[51] Int. Cl.[4] ..... H01L 29/34; H01L 29/92

[52] U.S. Cl. ..... 357/52; 357/14; 357/54

[58] Field of Search ..... 357/52, 52 C, 54, 54 N, 357/54 A, 14, 23, 15, 53; 437/234

[56] References Cited

U.S. PATENT DOCUMENTS

| | | | |
|---|---|---|---|
| 3,689,392 | 9/1972 | Sandera | 357/54 X |
| 3,717,514 | 2/1973 | Burgess | 357/54 X |
| 3,883,889 | 5/1975 | Hall | 357/54 X |
| 4,257,832 | 3/1981 | Schwabe et al. | 357/54 X |
| 4,297,149 | 10/1981 | Koons et al. | 148/1.5 |
| 4,399,449 | 8/1983 | Herman et al. | 357/53 |
| 4,430,663 | 2/1984 | D'Altroy et al. | 357/53 |
| 4,580,156 | 4/1986 | Comizzoli | 357/53 |
| 4,737,379 | 4/1988 | Hudgens et al. | 437/234 X |

FOREIGN PATENT DOCUMENTS

| | | | |
|---|---|---|---|
| 59-229871 | 12/1984 | Japan | 357/54 N |

OTHER PUBLICATIONS

Brown et al, "Electrical Characteristics of Silicon Nitride Films Prepared by Silane-Ammonia Reaction," *J. Electrochem. Soc.,* vol. 115, No. 9, Sep. '68, 948-950.

"Herstellungsverfahren für eine Halbleiteranoronung," *Neues aus der Technik,* No. 3, vol. 15, Jun. 1974, p. 3.

High-Voltage Planar Structure Using Si-$O_2$-SIPOS-$SiO_2$ Film, A. Mimura et al., IEEE Electron Device Letters, vol. EDL-6, No. 4, Apr. 1985.

Characterization and Modelling of SIPOS on Silicon High-Voltage Devices, J. N. Sandoe et al., IEE Proceedings, vol. 132, Pt. I, No. 6, Dec. 1985.

*Primary Examiner*—Thomas H. Tarcza
*Assistant Examiner*—Linda J. Wallace
*Attorney, Agent, or Firm*—Wendy W. Koba

[57] ABSTRACT

A high voltage silicon device with a resistive field shield comprising semi-insulating silicon nitride (sinSiN). The N/Si ratio is controlled to provide the resistive field shield with the desired conductivity. This resistive field shield material may also serve as an outer protection layer for the device.

5 Claims, 3 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

RESISTIVE FIELD SHIELDS FOR HIGH VOLTAGE DEVICES

BACKGROUND OF THE INVENTION

1. Technical Field

The present invention relates to high voltage devices with improved resistive field shields and, more particularly, to high voltage devices with resistive field shields comprising a layer of semi-insulating silicon nitride (sin-SiN).

2. Description of the Prior Art

The breakdown voltage and/or leakage current of high voltage discrete devices and integrated circuits will be degraded by the presence of charge (usually ionic) on the top surface of the outermost passivation layer. These mobile charges may also form a surface channel which can effectively create a shunt resistor between the emitter-base, emitter-collector, or collector-base electrodes. In the presence of an electric field, high temperature, and/or moisture, these surface ions can redistribute and create large extrinsic potentials on the surface of the chip. Additionally, cracks or pinholes in the top passivation layer will allow charge to leak up into or on top of this layer and spread out from the point of origination. If the potential generated by this leakage charge is different from that of the silicon below it, field crowding results, leading to a degradation of both the breakdown voltage and leakage current of the high voltage device.

A technique for limiting this effect is to shield the surface of the device from the effects of the charge by using a resistive field shield which contacts the surface and makes electrical contact to conductors on the surface. A semi-insulating polysilicon (SIPOS) layer may be used as such a shield. A description of this type of field shield may be found in the article entitled "Characterisation and modelling of SIPOS on silicon high-voltage devices" by J. N. Sandoe et al. appearing in *IEE Proceedings,* Vol. 132, Pt. 1, No. 6, December 1985 at pp. 281–3. One problem created by the use of a SIPOS shield layer is that it introduces leakage which may be greater than is acceptable in some applications (extreme high voltage applications, for example).

One technique for increasing the effectiveness of a SIPOS field shield is disclosed in U.S. Pat. No. 4,580,156 issued to R. B. Comizzoli on Apr. 1, 1986. A segmented SIPOS layer is used by Comizzoli as a resistive field shield, where the segmentation of the layer significantly increases the resistance thereof and thereby limits the leakage generated by the layer. The segmentation, however, adds to the complexity of the device fabrication process. An alternative method of improving SIPOS passivation is disclosed in U.S. Pat. No. 4,297,149 issued to P. R. Koons et al. on Oct. 27, 1981. This method requires the annealing of the device at a temperature of approximately 550° C. prior to metallization and alloying of the metal electrodes at a temperature less than 425° C. It is thought that this temperature control technique changes the types of oxygen-silicon bonds present in the SIPOS layer so as to improve the device performance. However, the device may never again be exposed to temperatures greater than 425° C., or the breakdown problem will return.

As a material, SIPOS has further problems which limit its usefulness as a passivation material. Firstly, SIPOS is extremely reactive in a humid environment, experiencing drastic conductivity changes (both increases and decreases) which are neither well-controlled nor well-understood. In particular, when SIPOS is in contact with aluminum metallization, the aluminum will penetrate the surface, forming $Al_2O_3$ at the interface. Thus, SIPOS is essentially limited to utilization with devices encased to hermetic packages, resulting in increasing the cost (and perhaps size) of the final packaged device. Additionally, when SIPOS is used with tri-level metal contacts (Ti-Pt-Au), the gold will migrate through the contact, forming various eutectic compounds with the SIPOS. Again, these compounds will seriously degrade the performance of the device.

Thus, a need remains in the prior art for a resistive field shield for high voltage devices which overcomes these and other limitations associated with SIPOS resistive field shields.

SUMMARY OF THE INVENTION

The present invention relates to a high voltage device with an improved resistive field shield and, more particularly, to a high voltage device with a semi-insulating silicon nitride (sin-SiN) resistive field shield.

In the preferred embodiment, the present invention is directed to utilizing a sin-SiN passivation layer with a predetermined N/Si ratio so as to provide the necessary conductivity of the field shield layer.

It is an aspect of the present invention to provide a high voltage device capable of withstanding voltages greater than $1\times10^5$ V/cm, while exhibiting increased breakdown voltages over prior art devices in the range of 20–40 V.

Another aspect of the present invention is to utilize a resistive field shield as a top passivation layer for the device which is capable of shielding the device from surface charges.

These and other aspects of the present invention will be clearly understood from a reading of the following description and by reference to the accompanying drawings.

BRIEF DESCRIPTION OF THE DRAWING

Referring now to the drawings.

DETAILED DESCRIPTION

Figure 1:
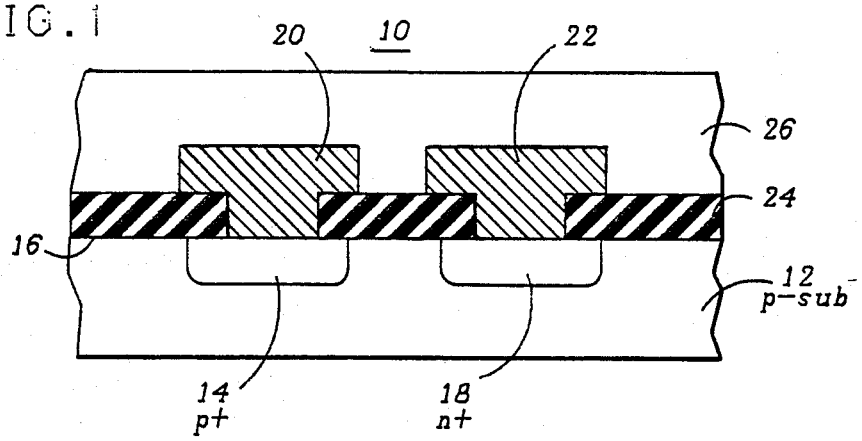
FIGS. 1–5 illustrate, in cross-sectional views, various exemplary high voltage devices formed with a semi-insulating silicon nitride (sin-SiN) resistive field shield of the present invention.

An exemplary high voltage device 10 formed with the semi-insulating silicon nitride (sin-SiN) resistive field shield layer of the present invention is illustrated in cross-sectional form in FIG. 1. Device 10 comprises a semiconductor substrate 12 of a first conductivity type, shown as p-type in FIG. 1. A first diffusion region 14 of the same conductivity type, but higher dopant concentration, is formed through surface 16 of substrate 12. A second diffusion region 18, of the opposite conductivity type, is also formed through surface 16, at a location spaced-apart from first diffusion region 14. A pair of metal electrodes 20,22 are formed to contact first and second diffusions 14 and 18, respectively. A dielectric layer 24 is disposed across surface 16 of substrate 12 to provide electrical isolation between electrodes 20 and 22.

In accordance with the present invention, the structure is then covered with a layer of semi-insulating silicon nitride (sin-SiN) which forms the resistive field shield 26 of the high voltage device. As described above, resistive field shield 26 function to isolate any charge in or on the device surface, shielding the active device regions formed below. The field of the ionic charge is essentially terminated in the resistive layer and does not reach or effect the silicon below.

Figure 2:
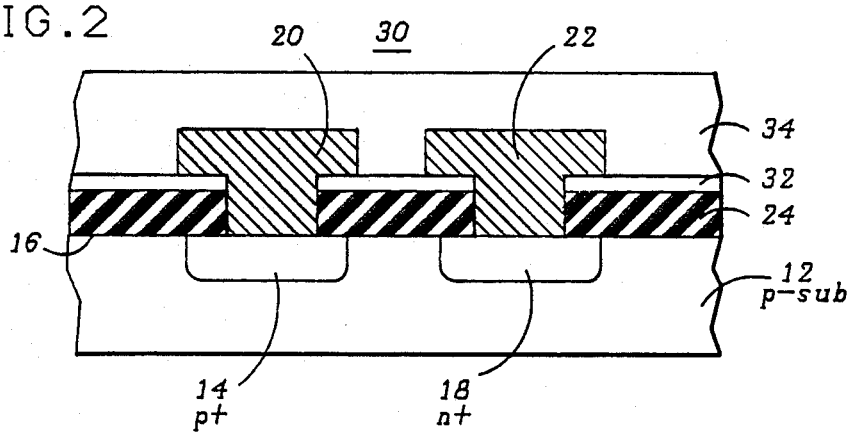
Figure 3:
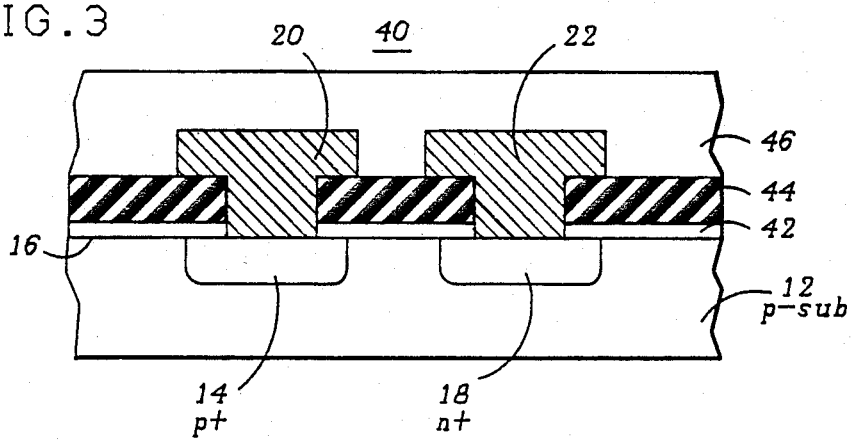

In some instances, it may not be desirable to utilize the sin-SiN material as the outer protection layer of the device. Also, the use of a relatively thick sin-SiN layer, similar to layer 26 of FIG. 1, may be disadvantageous in some circumstances. An alternative high voltage structure 30 utilizing the sin-SiN passivation layer of the present invention is illustrated in FIG. 2. The identical active device is illustrated for the sake of comparison, namely, a p-type substrate 12 including p+ diffusion region 14 and n+ diffusion region 18, both formed through top major surface 16 of substrate 12. Metal contacts 20 and 22 to regions 14 and 18, respectively, are insulated by dielectric layer 24. In this particular embodiment, a sin-SiN passivation layer 32 is formed over dielectric layer 24, layer 32 being patterned simultaneously with layer 24 to expose regions 14 and 18 for subsequent metallization. An outer protective layer 34 of a low temperature dielectric, for example, silicon nitride, is utilized with this particular device structure. FIG. 3 illustrates a slight modification of device 30 of FIG. 2. Here, a high voltage device 40 utilizes a relatively thin sin-SiN passivation layer 42 which is directly disposed over top major surface 16 of substrate 12. Insulation between active device regions is provided by a dielectric layer 44 which is formed over sin-SiN layer 42. As with device 30 of FIG. 2, the outer protection layer 46 comprises a low temperature dielectric.

Figure 4:
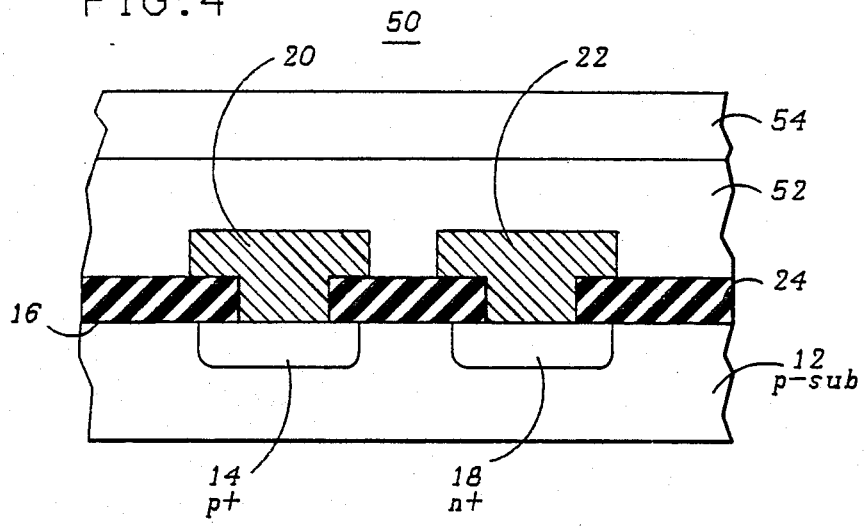
Figure 5:
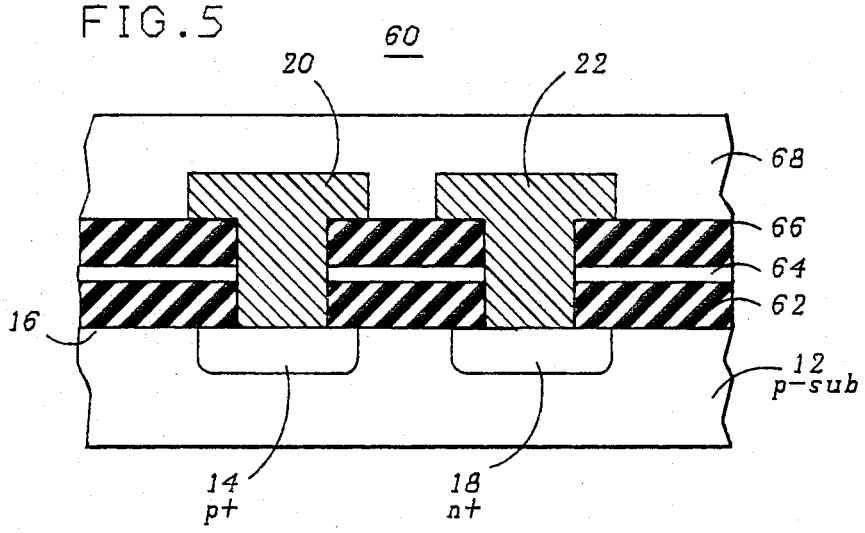

FIG. 4 illustrates yet another device structure which can be formed with the sin-SiN layer of the present invention. Here, a high voltage device 50 utilizes a conventional dielectric layer 24 over surface 16 of substrate 12. A first layer 52 of a low temperature dielectric is disposed to cover the exposed portions of dielectric layer 24, as well as contacts 20 and 22. A relatively thick sin-SiN passivation layer 54 is then deposited to completely cover layer 52. Yet another alternative device structure 60 which may be formed utilizing the sin-SiN passivation layer of the present invention is illustrated in FIG. 5. As shown, the dielectric layer of the other arrangements is replaced with a tri-level structure, including a first dielectric layer 62, a layer 64 of sin-SiN, and a final dielectric layer 66, disposed to cover the sin-SiN passivation layer. This tri-level structure is then etched to expose regions 14 and 18 for contact for metallizations 20 and 22, respectively. An outer layer 68 of a low temperature dielectric may then be utilized as the final layer of this particular structure.

Figure 6:
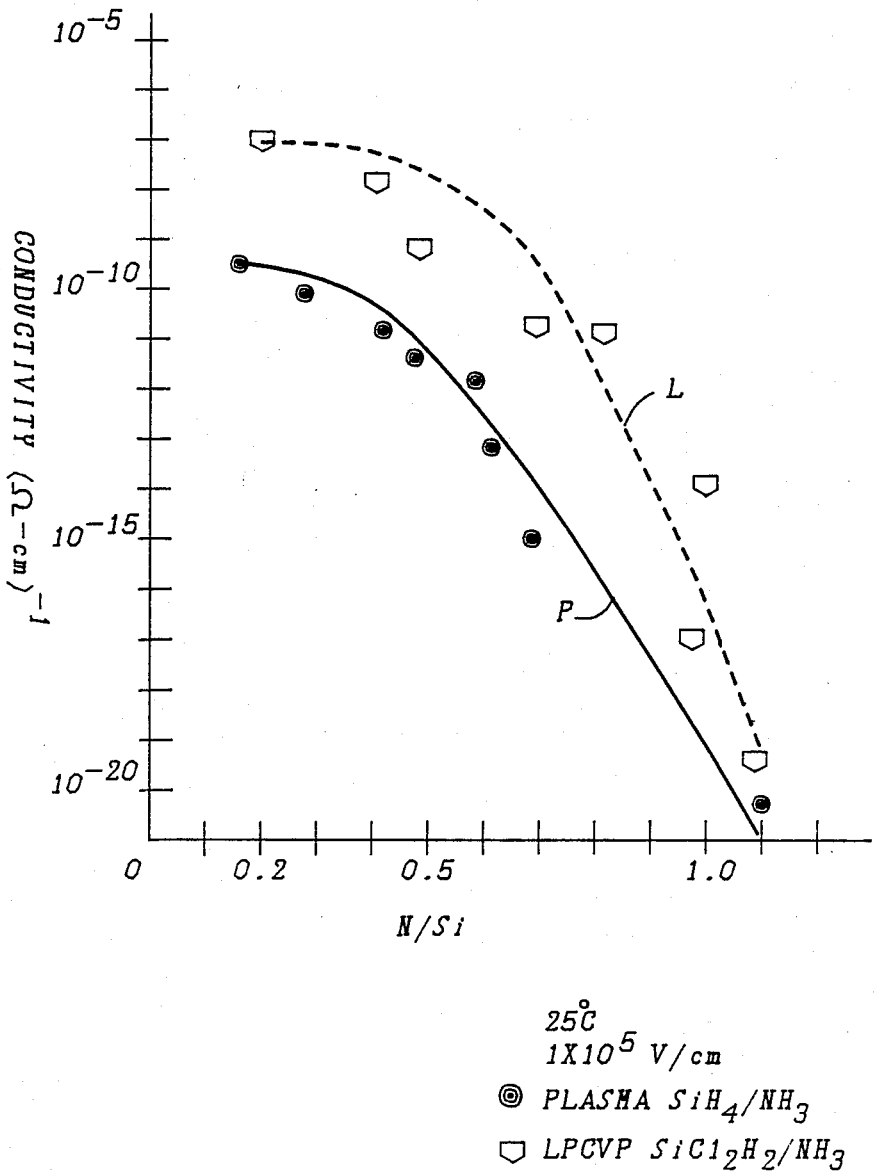
FIG. 6 is a graph illustrating the relationship between conductivity of the sin-SiN resistive field shield as a function of its N/Si ratio.

In accordance with the teachings of the present invention, any suitable deposition technique (e.g., LPCVD, MOCVD, plasma) may be used to form the novel sin-SiN passivation layer. It has been found that regardless of the deposition technique, the control of the N/Si ratio in the sin-SiN layer will affect is conductivity. This relationship between the N/Si ratio and conductivity $\sigma$ is illustrated in FIG. 6 for two exemplary sin-SiN deposition processes. The first process, a plasma deposition process, utilizes the gases $SiH_4$ and $NH_3$. The plot of its conductivity (at an applied field of $1\times10^5$ V/cm) as a function of N/Si ratio is illustrated by the letter "P" in FIG. 6. As seen, this particular plasma deposition process yields a film with the greatest conductivity (approximately $4\times10^{-10}$ $(\Omega\text{-cm})^{-1}$) with a N/Si ratio of about 1/5. The conductivity then decreases in a somewhat linear fashion as the concentration of N is increased, until a conductivity of about $1\times10^{-19}$ is reached for a 1/1 N/Si ratio. The conductivity as a function of N/Si is also illustrated in FIG. 6 for an exemplary LPCVD process which utilizes $SiCl_2H_2$ and $NH_3$ to form the passivation layer. The plot of this conductivity as a function of N/Si is denoted by the letter "L" in FIG. 6. As can be seen, this curve roughly follows the contour of the P plot for the plasma deposition process, although yielding somewhat lower conductivity values for like N/Si ratios. For example, a N/Si ratio of 1/5 for the LPCVD process will yield a sin-SiN layer with a conductivity of approximately $1\times10^{-7}$ $(\Omega\text{-cm})^{-1}$, over two orders of magnitude lower than that associated with the same ratio in the plasma process. A 1/1 N/Si ratio in the LPCVD process results in the formation of a sin-SiN layer with a conductivity of approximately $1\times10^{-16}(\Omega\text{-cm})^{-1}$. It is to be understood that various other values of conductivity may be obtained, depending upon the deposition process, applied field, ambient temperature, and other conditions. The two plots of FIG. 6 are meant to be exemplary only, teaching in principle that the conductivity of the sin-SiN passivation layer of the present invention may be modified to provide the value desired by the user.

In the formation of a specific device, there may exist upper and lower limits on the conductivity of a sin-SiN resistive layer. The upper limit on conductivity can be dictated by the leakage requirements of the device at maximum operating voltage, minimum metal-to-metal spacing, and metal-to-field shield area ratio. The lower limit may be determined by the minimum dielectric relaxation time ($\tau$) is given by:

$$\tau=\epsilon\rho/4\pi \qquad (1)$$

where $\rho$ is the resistivity of the film and $\epsilon$ is the dielectric constant of the material. As long as $\tau$ is less than or equal to the mobility of the ions causing the device instability, the ions will be neutralized by the resistive field shield. For the sin-SiN film of the present invention, the dielectric constant $\epsilon$ is approximately 8. For a conventional relaxation time $\tau$ of 100 seconds, the lower limit on conductivity (the inverse of the resistivity $\rho$ from equation (1)) will be approximately $5\times10^{-13}$ $(\Omega\text{-cm})^{-1}$.

EXAMPLE

A sin-SiN resistive field shield was deposited onto a set of gated diode crosspoint devices and associated control substrates in a hot wall horizontal tube plasma reactor operated at 400 kHz, 200 watts rf-power, and 360° C. The gases used were $NH_3$ and $SiH_4$. The total pressure was 2 torr, and the total gas flow was kept at 1200 SCCM. The $NH_3/SiH_4$ ratio was varied from 5/1 to 1/2. The films were deposited on aluminum-coated 100 mm oxidized (1 $\mu$m $SiO_2$) silicon wafers. The aluminum thickness was 1.5 $\mu$m and the sin-SiN thickness was 1.2 $\mu$m. After the sin-SiN films were deposited, the wafers were annealed at 450° and 500° C. in nitrogen for 48 hours.

The matrix of gas flow rates and deposition times were used are given below in Table I.

TABLE I

| Sample | $NH_3$ (SCCM) | $SiH_4$ (SCCM) | $NH_3/SiH_4$ | Dep. time (min.) |
|---|---|---|---|---|
| | Deposition Conditions for the Plasma Deposited SinSiN Films | | | |
| 1 | 1000 | 200 | 5.0 | 55 |
| 2 | 960 | 240 | 4.0 | 40 |
| 3 | 933 | 267 | 3.5 | 25 |
| 4 | 900 | 300 | 3.0 | 25 |
| 5 | 857 | 343 | 2.5 | 25 |
| 6 | 800 | 400 | 2.0 | 25 |
| 7 | 600 | 600 | 1.0 | 30 |
| 8 | 400 | 800 | 0.5 | 30 |

Table II contains the average thickness, refractive index, deposition rate, film stress and N/SI ratio for the various gas flow ratios.

TABLE II

| $NH_3/SiH_4$ | N/Si | RI | Thickness ($\mu$m) | Dep. Rate (nm/min) | Stress ($10^{\circ}$ dynes/cm$^2$) |
|---|---|---|---|---|---|
| | Stoichiometry, Refractive Index, Thickness, Deposition Rate and Stress | | | | |
| 5.0 | 1.1 | 2.1 | 1.2 | 22 | $-3.0 \pm 2.0$ |
| 4.0 | 0.69 | 2.35 | 1.1 | 28 | $-2.8 \pm 2.3$ |
| 3.5 | 0.61 | 2.35 | 1.1 | 28 | $-2.8 \pm 1.5$ |
| 3.0 | 0.56 | 2.6 | 1.05 | 42 | $-4.0 \pm 2.4$ |
| 2.5 | 0.47 | 2.8 | 1.1 | 44 | $-4.0 \pm 2.2$ |
| 2.0 | 0.43 | 2.8 | 0.92 | 37 | $-4.6 \pm 1.5$ |
| 1.0 | 0.26 | 3.0 | 0.95 | 32 | $-6.0 \pm 2.1$ |
| 0.5 | 0.15 | 3.1 | 0.90 | 30 | $-9.0 \pm 3.0$ |

From these results, it is clear that the N/SI flow ratio determines the stoichiometry of these films. This is expected since the only source of nitrogen is $NH_3$ and the only source of silicon is $SiH_4$.

Gated diode crosspoint devices passivated with a sin-SiN layer of the appropriate N/Si ratio exhibited breakdown voltages that were controlled solely by the intrinsic properties of the silicon, rather than by the extrinsic surface charges. These devices also exhibited increased breakdown over prior art arrangements, in the range of 20–40 V. Furthermore, it is no longer necessary to perform a burn-in step to eliminate mobile surface charges, as required for prior art structures, since the sin-SiN passivation layer of the present invention removes any device sensitivity to these charges. The elimination of this burn-in procedure directly results in improving the yield of the gated diode crosspoint devices.

What is claimed is:

1. A semiconductor structure comprising a semiconductor substrate of a first conductivity type, said substrate being defined as having top and bottom major surfaces;

a first semiconductor region of the first conductivity type more heavily doped than said substrate and formed in a portion of said semiconductor substrate so as to coincide with the top major surface;

a second semiconductor region of the second conductivity type more heavily doped than said substrate and formed in a portion of said semiconductor substrate so as to coincide with said top major surface and spaced-apart from said first semiconductor region;

first and second electrode means contacting said first and second semiconductor regions, respectively;

a dielectric insulating layer disposed over said substrate for electrically isolating said first and second semiconductor regions; and a resistive field shield layer comprising semi-insulating silicon nitride (sin-SiN) for limiting the potential buildup caused by electrical charge on said dielectric insulating layer.

2. A semiconductor structure as defined in claim 1 wherein the semi-insulating silicon nitride resistive field shield layer comprises a N/Si ratio in the range of about 1/1 to about 1/5.

3. A semiconductor structure as defined in claim 1 wherein the semi-insulating silicon nitride resistive field shield layer is interposed between the semiconductor substrate and the dielectric insulating layer.

4. A semiconductor structure as defined in claim 1 wherein the dielectric insulating layer is interposed between the semiconductor substrate and the semi-insulating silicon nitride resistive field shield layer.

5. A semiconductor structure as defined in claim 1 wherein the dielectric insulating layer comprises at least two individual layers and the semi-insulating silicon nitride resistive field shield layer is interposed between the at least two individual layers.

* * * * *